United States Patent
Ahn et al.

(10) Patent No.: US 7,692,985 B2
(45) Date of Patent: Apr. 6, 2010

(54) SEMICONDUCTOR MEMORY DEVICE CAPABLE OF DETECTING BRIDGE DEFECTS AND BRIDGE DEFECT DETECTING METHOD PERFORMED IN THE SEMICONDUCTOR MEMORY DEVICE

(75) Inventors: Soon-hong Ahn, Hwaseong-si (KR); Chi-wook Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 433 days.

(21) Appl. No.: 11/775,513

(22) Filed: Jul. 10, 2007

(65) Prior Publication Data
US 2008/0031062 A1 Feb. 7, 2008

(30) Foreign Application Priority Data
Aug. 1, 2006 (KR) ...................... 10-2006-0072658

(51) Int. Cl.
*G11C 7/00* (2006.01)
(52) U.S. Cl. ...................... 365/201; 365/200; 365/206; 365/207
(58) Field of Classification Search .................. 365/201, 365/200, 206, 207, 189.14
See application file for complete search history.

(56) References Cited

U.S. PATENT DOCUMENTS

| 6,396,754 | B1 * | 5/2002 | Lee et al. | 365/201 |
| 6,459,634 | B1 * | 10/2002 | Sher | 365/201 |
| 6,650,584 | B2 * | 11/2003 | Cowles | 365/201 |

FOREIGN PATENT DOCUMENTS

| JP | 2004-039124 | 2/2004 |
| KR | 1020050030328 A | 3/2005 |
| KR | 1020060023632 A | 3/2006 |

* cited by examiner

*Primary Examiner*—Anh Phung
*Assistant Examiner*—Toan Le
(74) *Attorney, Agent, or Firm*—F. Chau & Associates, LLC

(57) ABSTRACT

A bridge defect detecting method performed in a semiconductor memory device that includes a plurality of memory cells arranged at intersections between a plurality of word lines and a plurality of bit lines and a plurality of sense amplifiers connected to the bit lines, includes the operations of: enabling a first sense amplifier and a second sense amplifier; keeping the first sense amplifier in an enabled state and disabling the second sense amplifier; enabling the second sense amplifier, and detecting a bridge defect between the first memory cell and the second memory cell by reading data from a first memory cell of a first bit line connected to the first sense amplifier and a second memory cell of a second bit line connected to the second sense amplifier.

28 Claims, 4 Drawing Sheets

SEMICONDUCTOR MEMORY DEVICE CAPABLE OF DETECTING BRIDGE DEFECTS AND BRIDGE DEFECT DETECTING METHOD PERFORMED IN THE SEMICONDUCTOR MEMORY DEVICE

CROSS-REFERENCE TO RELATED PATENT APPLICATION

This application claims the benefit of Korean Patent Application No. 10-2006-0072658, filed on Aug. 1, 2006, in the Korean Intellectual Property Office, the disclosure of which is incorporated herein in its entirety by reference.

BACKGROUND OF THE INVENTION

1. Technical Field

The present disclosure relates to a semiconductor memory device and a method of testing the semiconductor memory device and, more particularly, a semiconductor memory device capable of detecting a bridge defect and a bridge defect detecting method performed in the semiconductor memory device.

2. Discussion of Related Art

As the integration of semiconductor memory devices increases, the sizes of circuits of the semiconductor memory devices decrease. Accordingly, in the formation of the circuits of a semiconductor memory device, a process margin decreases. Thus, the possibility that a bridge defect is generated between adjacent memory cells increases. A bridge defect denotes a phenomenon in which a leakage current is generated due to a formation of a undesired current path between adjacent memory cells. When a bridge defect is generated between adjacent memory cells, the data stored in the memory cells may be lost.

To detect such a bridge defect, a conventional semiconductor memory device enables sense amplifiers connected to memory cells, when a predetermined period of time has passed after storing data in the memory cells. Then, the conventional semiconductor memory device reads out the data stored in the memory cells and detects whether a bridge defect has been generated or not based on the read data.

While the sense amplifiers are being enabled, however, coupling may occur between bit lines connected to the sense amplifiers.

When a bridge defect and a coupling phenomenon occur simultaneously, the bridge defect cannot be properly detected. Furthermore, it is more deleterious when a bridge defect generated between memory cells connected to the same word line cannot be detected.

SUMMARY OF THE INVENTION

Exemplary embodiments of the present invention provide a semiconductor memory device that maintains a sense amplifier at an enable state.

Exemplary embodiments of the present invention also provide a bridge defect detecting method performed in a semiconductor memory device that maintains a sense amplifier at an enable state.

According to an exemplary embodiment of the present invention, there is provided a bridge defect detecting method performed in a semiconductor memory device that comprises a plurality of memory cells arranged at intersections between a plurality of word lines and a plurality of bit lines and a plurality of sense amplifiers connected to the bit lines, the method comprising the operations of: enabling a first sense amplifier and a second sense amplifier; keeping the first sense amplifier in an enabled state and disabling the second sense amplifier; enabling the second sense amplifier; and detecting a bridge defect between the first memory cell and the second memory cell by reading data from a first memory cell of a first bit line connected to the first sense amplifier and a second memory cell of a second bit line connected to the second sense amplifier.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
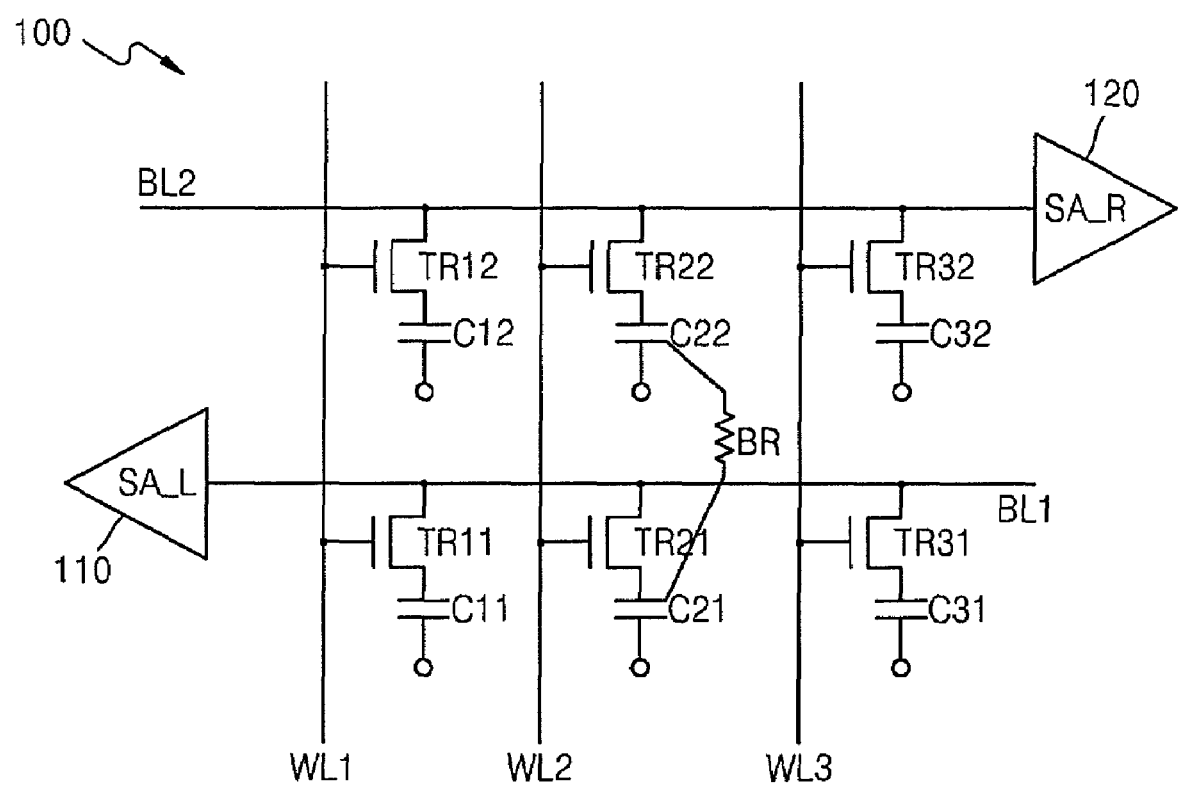
FIG. 1 is a circuit diagram for explaining a bridge defect and a coupling phenomenon that are generated in a semiconductor memory device.

The attached drawings for illustrating exemplary embodiments of the present invention are referred to in order to gain a sufficient understanding of the present invention, the merits thereof, and the objectives accomplished by the exemplary implementation of the present invention.

Hereinafter, the present invention will be described in detail by explaining exemplary embodiments with reference to the attached drawings. Like reference numerals in the drawings denote like elements.

FIG. 1 is a circuit diagram useful in explaining a bridge defect and a coupling phenomenon that are generated in a semiconductor memory device 100. Referring to FIG. 1, a bridge defect BR is generated between cell capacitors C21 and C22. Therefore, a current path is formed from the cell capacitor C21 to the cell capacitor C22 due to the bridge defect BR.

Moreover, when sense amplifiers 110 and 120 are enabled to read data from the cell capacitors C21 and C22, coupling may be generated between bit lines BL1 and BL2. In this case, the value of the data read from the cell capacitors C21 and C22 may be changed due to the coupling.

Figure 2:
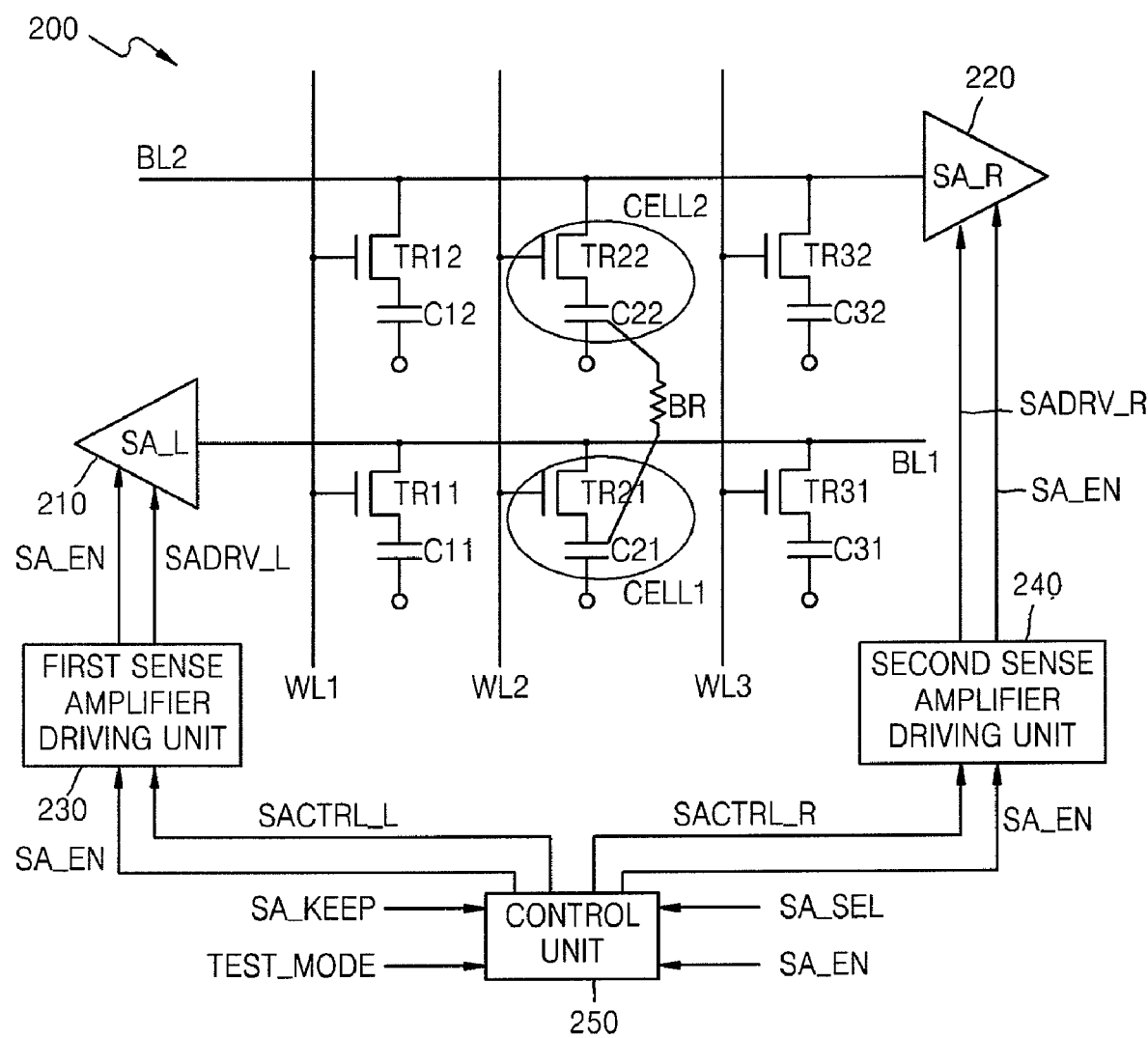
FIG. 2 is a block diagram of a semiconductor memory device according to an exemplary embodiment of the present invention that is capable of detecting a bridge defect.

FIG. 2 is a block diagram of a semiconductor memory device 200 according to an exemplary embodiment of the present invention that is capable of detecting a bridge defect. For the convenience of this explanation, FIG. 2 illustrates only three word lines two bit lines, and six memory cells.

Referring to FIG. 2, the semiconductor memory device 200 includes a plurality of memory cells including CELL1 and CELL2, a plurality of sense amplifiers 210 and 220, and a control unit 250. The memory cells CELL1 and CELL2 are disposed at intersections between a plurality of word lines WL1 through WL3 and a plurality of bit lines BL1 and BL2. The sense amplifiers 210 and 220 sense and amplify the potentials of the bit lines BL1 and BL2, respectively. The control unit 250 maintains the first sense amplifier 210 connected to the first bit line BL1 in an enabled state and disables the second sense amplifier 220 connected to the second bit line BL2, while a sense amplifier keeping signal SA_KEEP fed to the control unit 250 is activated.

The control unit 250 may also keep the first sense amplifier 210 in an enable state in response to a mode register setting (MRS) (not shown) signal or a control signal received from an external pad (not shown) of the semiconductor memory device 200.

The control unit 250 may keep the first sense amplifier 210 in an enable state and disable the second sense amplifier 220 after selecting a sub memory block, formed of two or more memory cells, connected to the first and second sense amplifier 210 and 220. In other words, the control unit 250 may select a sub memory block at which the existence or nonexistence of a bridge defect is to be determined. The control unit 250 may select the sub memory block connected to the first and second sense amplifiers 210 and 220, in response to the MRS signal or the control signal received from the external pad (not shown) of the semiconductor memory device 200.

The semiconductor memory device 200 may further include first and second sense amplifier driving units 230 and 240. The first and second sense amplifier driving units 230 and 240 drive the first and second sense amplifiers 210 and 220, respectively, by outputting sense amplifier driving signals SADRV_L and SADRV_R in response to sense amplifier control signals SACTRL_L and SACTRL_R output from the control unit 250.

The first and second bit lines BL1 and BL2 may be adjacent each other.

The semiconductor memory device 200 may have a structure with an open bit line shape. The open bit line shape is one in which the adjacent bit lines BL1, BL2 respectively are connected to the different sense amplifiers 210 and 220 as illustrated in FIG. 2.

Figure 3:
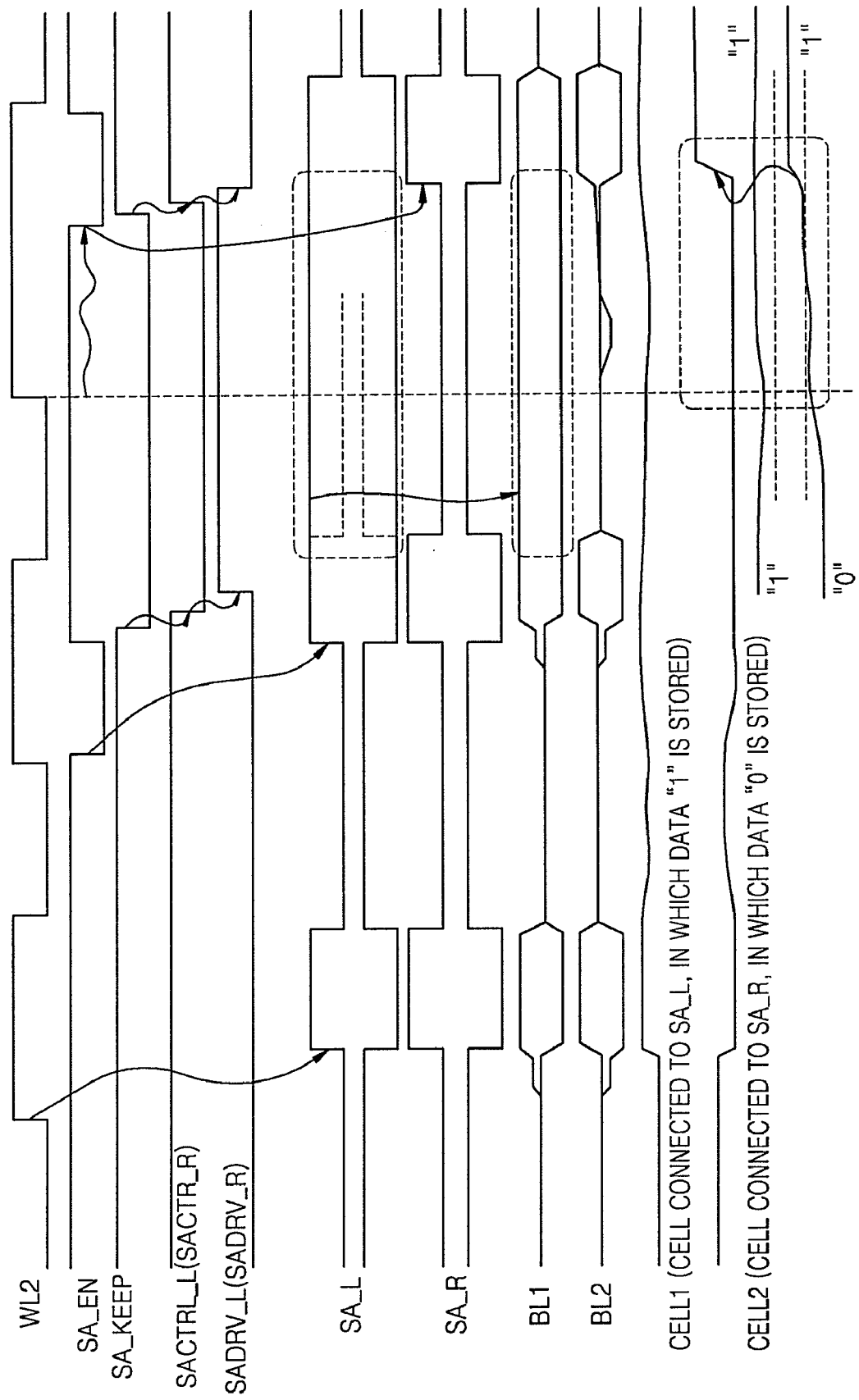
FIG. 3 is a timing diagram of an operation of the semiconductor memory device illustrated in FIG. 2.

FIG. 3 is a timing diagram of an operation of the semiconductor memory device 200 illustrated in FIG. 2.

Figure 4:
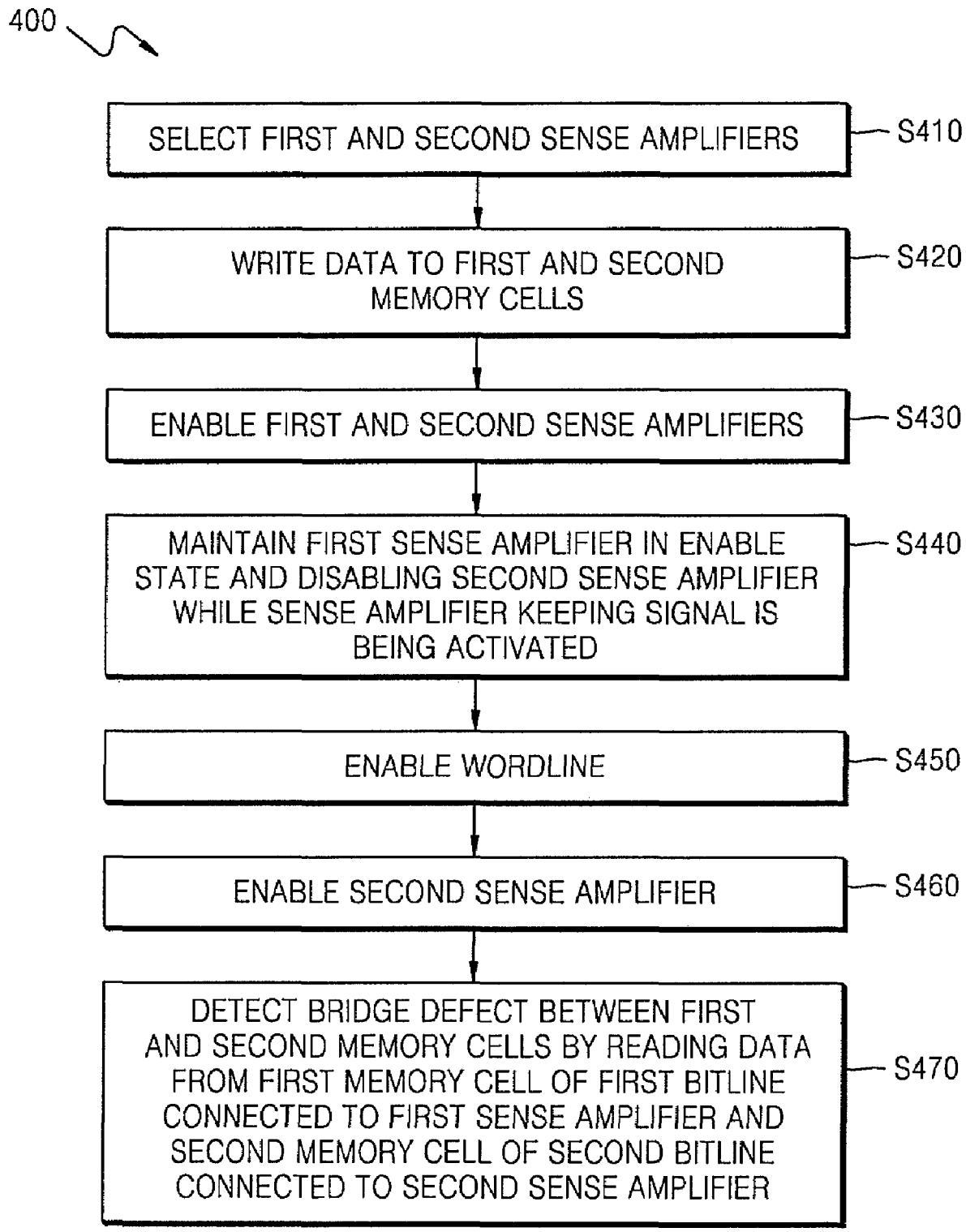
FIG. 4 is a flowchart of a bridge defect detecting method performed in a semiconductor memory device, according to an exemplary embodiment of the present invention.

FIG. 4 is a flowchart of a bridge defect detecting method 400 according to an exemplary embodiment of the present invention performed in a semiconductor memory device.

The bridge defect detecting method 400 includes an operation S430 of enabling first and second sense amplifiers, an operation of S440 of maintaining the first sense amplifier in an enable state and disabling the second sense amplifier while a sense amplifier keeping signal is being activated, an operation S460 of enabling the second sense amplifier, and an operation S470 of detecting a bridge defect between the first and second memory cells by reading data from a first memory cell of a first bit line connected to the first sense amplifier and a second memory cell of a second bit line connected to the second sense amplifier.

In the operation S440, the first sense amplifier can be kept in an enable state in response to an MRS signal (not shown) or a control signal received from an external pad (not shown) of the semiconductor memory device.

The bridge defect detecting method 400 may further include an operation S450 of enabling a word line, after the operation S440. In this case, in the operation S470, data is read from first and second memory cells connected to the enabled word line.

The bridge defect detecting method 400 may further include an operation S410 of selecting the first and second sense amplifiers, before the operation S430. In the operation S410, the first or second sense amplifier may be selected in response to the MRS signal or the control signal received from the external pad (not shown) of the semiconductor memory device.

The bridge defect detecting method 400 may further include an operation S420 of writing data to the first and second memory cells, before the operation S430.

The bridge defect detecting method 400 will now be described with reference to FIGS. 2 through 4.

In the operation S410 of the bridge defect detecting method 400, the first and second sense amplifiers 210 and 220 are selected. More specifically, the first and second sense amplifiers 210 and 220 that are connected to the sub memory block, on which existence or nonexistence of a bridge defect is to be determined, are selected. Next, data is written to the first and second memory cells CELL1 and CELL2 included in the sub memory block, in the operation 420. For example data with a logic high level "1" may be written to the first memory cell CELL1, and data with a logic low level "0" may be written to the second memory cell CELL2.

In the operation S430, the first and second sense amplifiers 210 and 220 are enabled in response to sense amplifier enable signals SA_EN fed thereto from the first and second sense amplifier driving units 230 and 240, respectively. Thereafter, in the operation S440, while the sense amplifier keeping signal SA_KEEP is being activated, the first sense amplifier 210 is kept in an enabled state, and the second sense amplifier 220 is disabled by the control unit. In other words, in the bridge defect detecting method 400, the second sense amplifier 220 is disabled after being enabled, while the first sense amplifier 210 is kept in an enabled state.

The operation of keeping the first sense amplifier 210 in the enabled state may be performed according to the sense amplifier control signal SACTRL_L activated to a logic low level or the sense amplifier driving signal SADRV_L activated to a logic low level. Meanwhile, the control unit 250 outputs the sense amplifier control signal SACTRL_L activated to a logic low level, in response to the sense amplifier keeping signal SA_KEEP activated to a logic low level, The sense amplifier driving unit 230 outputs the sense amplifier driving signal SADRV_L activated to a logic low level in response to the sense amplifier control signal SACTRL_L activated to a logic low level.

A section in which the first sense amplifier 210 is kept in the enabled state may be a section in which the second bit line BL2 connected to the second sense amplifier 220 is precharged. Also, the section in which the first sense amplifier 210 is kept in the enabled state may be a section in which the sense amplifier keeping signal SA_KEEP is activated to a logic low level or a logic high level. Further, the section where the first sense amplifier 210 is kept in the enabled state may be greater than a section in which data loss occurs due to a bridge defect BR between the first and second memory cells CELL1 and CELL2.

Then, in operation S450, the word line WL2 is enabled. The word line WL2 is connected to the first and second memory cells CELL1 and CELL2. In operation S460, the second sense amplifier 220 disabled in the operation S440 is enabled. Accordingly, both the first sense amplifier 210 and the second sense amplifier 220 are in an enabled state. In other words, the second sense amplifier 220 is enabled in the operation S460.

In the bridge defect detecting method 400, the first sense amplifier 210 is kept in an enabled state. Therefore, the first sense amplifier 210 and the second sense amplifier 220 do not perform a conversion from a disabled state to an enabled state simultaneously. Thus, coupling is not generated between the first and second bit lines BL1 and BL2.

Next, data is read from the first memory cell CELL1 of the first bit line BL1 connected to the first sense amplifier 210 and the second memory cell CELL2 of the second bit line BL2 connected to the second sense amplifier 220. As described above, since coupling is not generated between the first and second bit lines BL1 and BL2, a bridge defect between the first and second memory cells CELL1 and CELL2 may be accurately detected.

A bridge defect detecting method according to an exemplary embodiment of the present invention includes an operation of keeping a first sense amplifier in an enabled state and disabling a second sense amplifier and an operation of detecting a bridge defect. In the operation of keeping the first sense amplifier in an enabled state and disabling the second sense amplifier, in a section during which the sense amplifier keeping signal is activated between the times when a word line is enabled and when the word line is re-enabled, the first sense amplifier is kept in an enabled state, and the second sense amplifier is disabled. In the operation of detecting a bridge defect, a bridge defect between the first memory cell and the second memory cell is detected by reading data from a first memory cell disposed at an intersection between the word line and a first bit line connected to the first sense amplifier and data from a second memory cell disposed at an intersection between the word line and a second bit line connected to the second sense amplifier.

This bridge defect detecting method according to an exemplary embodiment of the present invention has the same technical spirit as that of the bridge defect detecting method 400, and the operations of the former bridge defect detecting method correspond to those of the bridge defect detecting method 400. Accordingly, the bridge defect detecting method according to an exemplary embodiment of the present invention will be understood from the above description by one of ordinary skill in the art to which the present invention pertains, so a detailed description thereof will be omitted.

As described above, in a semiconductor memory device capable of detecting a is bridge defect according to an exemplary embodiment of the present invention and a bridge defect detecting method performed in the semiconductor memory device, data is read out after a sense amplifier is kept in an enabled state. Thus, coupling is prevented from occurring between bit lines and the bridge defect is accurately detected.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bridge defect detecting method performed in a semiconductor memory device that comprises a plurality of memory cells arranged at intersections between a plurality of word lines and a plurality of bit lines and a plurality of sense amplifiers connected to the bit lines, the method comprising the operations of:
    enabling a first sense amplifier and a second sense amplifier;
    keeping the first sense amplifier in an enabled state and disabling the second sense amplifier;
    enabling the second sense amplifier; and
    detecting a bridge defect between a first memory cell and a second memory cell by reading data from the first memory cell of a first bit line connected to the first sense amplifier and the second memory cell of a second bit line connected to the second sense amplifier.

2. The bridge defect detecting method of claim 1, wherein the first sense amplifier is kept in an enabled state and the second sense amplifier is disabled while the second bit line connected to the second sense amplifier is precharged.

3. The bridge defect detecting method of claim 1, wherein a time during which the first sense amplifier is kept in an enabled state and the second sense amplifier is disabled is greater than a time during which data loss due to the bridge defect caused between the first and second memory cells occurs.

4. The bridge defect detecting method of claim 1, wherein the first and second bit lines are adjacent each other.

5. The bridge defect detecting method of claim 1, wherein the first and second memory cells are connected to the same word line.

6. The bridge defect detecting method of claim 1, wherein after the operation of keeping the first sense amplifier in an enabled state and disabling the second sense amplifier, further comprising the operation of enabling a word line, and
    wherein in the operation of detecting the bridge defect, data is read from the first and second memory cells connected to the enabled word line.

7. The bridge defect detecting method of claim 1, wherein in the operation of keeping the first sense amplifier in an enabled state and disabling the second sense amplifier, the first sense amplifier is kept in an enable state in response to a mode register setting signal or a control signal received from an external pad of the semiconductor memory device.

8. The bridge defect detecting method of claim 1, wherein before the operation of enabling the first and second sense amplifiers, further comprising the operation of selecting the first and second sense amplifiers.

9. The bridge defect detecting method of claim 8, wherein in the operation of selecting the first and second sense amplifiers, the first and second sense amplifiers are selected in response to a mode register setting signal or a control signal received from an external pad of the semiconductor memory device.

10. The bridge defect detecting method of claim 1, wherein before the operation of enabling the first and second sense amplifiers, further comprising the operation of writing data to the first and second memory cells.

11. The bridge defect detecting method of claim 1, wherein the semiconductor memory device has a structure with an open bit line shape.

12. The bridge defect detecting method of claim 1, wherein the first sense amplifier is kept in an enabled state and the second sense amplifier is disabled while a sense amplifier keeping signal is being activated.

13. A bridge defect detecting method performed in a semiconductor memory device that comprises a plurality of memory cells arranged at intersections between a plurality of word lines and a plurality of bit lines and a plurality of sense amplifiers connected to the bit lines, the method comprising the operations of:
    keeping a first sense amplifier in an enabled state and disabling a second sense amplifier, during a duration from when a word line is first enabled to when the word line is re-enabled; and
    detecting a bridge defect between a first memory cell and a second memory cell by reading data from the first memory cell of a first bit line connected to the first sense amplifier and the second memory cell of a second bit line connected to the second sense amplifier.

14. The bridge defect detecting method of claim 13, wherein after the operation of keeping the first sense amplifier in an enabled state and disabling the second sense amplifier, further comprising the operation of enabling the second sense amplifier, wherein in the operation of detecting the bridge defect, data is read from the second memory cell after the second sense amplifier is enabled.

15. The bridge defect detecting method of claim 13, wherein before the operation of keeping the first sense amplifier in an enabled state and disabling the second sense amplifier, further comprising the operation of enabling the first and second sense amplifiers.

16. The bridge defect detecting method of claim 13, wherein the first sense amplifier is kept in an enabled state and the second sense amplifier is disabled white the second bit line connected to the second sense amplifier is precharged.

17. The bridge defect detecting method of claim 13, wherein a time during which the first sense amplifier is kept in an enabled state and the second sense amplifier is disabled is greater than a time during which data loss due to the bridge defect caused between the first and second memory cells occurs.

18. The bridge defect detecting method of claim 13, wherein the first and second bit fines are adjacent each other.

19. The bridge defect detecting method of claim 13, wherein the first and second memory cells are connected to the same word line.

20. The bridge defect detecting method of claim 13, wherein the first sense amplifier is kept in an enabled state and the second sense amplifier is disabled while a sense amplifier keeping signal is being activated.

21. A semiconductor memory device comprising:
a plurality of memory cells arranged at intersections between a plurality of word lines and a plurality of bit lines;
a plurality of sense amplifiers sensing and amplifying potentials of the bit lines; and
a control unit keeping a first sense amplifier connected to a first bit line of the bit lines in an enabled state and disabling a second sense amplifier connected to a second bit line of the bit lines while a sense amplifier keeping signal is being activated.

22. The semiconductor memory device of claim 21, wherein the control unit keeps the first sense amplifier in an enable state in response to a mode register setting signal or a control signal received from an external pad of the semiconductor memory device.

23. The semiconductor memory device of claim 21, wherein the control unit keeps the first sense amplifier in an enable state and disables the second sense amplifier after selecting a sub memory block connected to the first and second sense amplifiers.

24. The semiconductor memory device of claim 21, wherein the control unit selects the sub memory block connected to the first and second sense amplifiers in response to the mode register setting signal or the control signal received from the external pad of the semiconductor memory device.

25. The semiconductor memory device of claim 21, further comprising first and second sense amplifier driving units driving the first and second sense amplifiers, respectively, in response to sense amplifier driving signals received from the control unit.

26. The semiconductor memory device of claim 21, wherein the semiconductor memory device has a structure with an open bit line shape.

27. The semiconductor memory device of claim 21, wherein a time during which the sense amplifier keeping signal is being activated is a time during which the second bit line connected to the second sense amplifier is precharged.

28. The semiconductor memory device of claim 21, wherein the first and second bit lines are adjacent each other.

* * * * *